United States Patent [19]
Choi et al.

[11] Patent Number: 5,642,065
[45] Date of Patent: Jun. 24, 1997

[54] ZERO-VOLTAGE SWITCHING CIRCUITRY, AS FOR USE IN RESONANT INVERTERS

[75] Inventors: Nak-choon Choi, Bucheon; Maeng-ho Seo, Seoul, both of Rep. of Korea

[73] Assignee: Samsung Electronics Co., Ltd., Suwon, Rep. of Korea

[21] Appl. No.: 572,335

[22] Filed: Dec. 14, 1995

[30] Foreign Application Priority Data

Dec. 14, 1994 [KR] Rep. of Korea .................... 94-34245

[51] Int. Cl.$^6$ ............................................. H03L 7/00
[52] U.S. Cl. .................................. 327/110; 327/141
[58] Field of Search ........................... 315/DIG. 7, 307, 315/224, 291; 327/108, 110, 131, 141, 408, 409, 410, 411, 412, 413, 423, 424, 427

[56] References Cited

U.S. PATENT DOCUMENTS 5,397,878  3/1995  Chen ........................ 327/110

Primary Examiner—Timothy P. Callahan
Assistant Examiner—Jeffrey Zweizig
Attorney, Agent, or Firm—Allen LeRoy Limberg

[57] ABSTRACT

Switching loss in push-pull switching transistors in a resonant inverter or the like, is minimized by assuring the switching of each of the transistors into conduction occurs when the voltage across its principal conduction path is zero-valued, or substantially so. This is done responsive to sensing the flow of forward currents through clamp diodes connected across the principal conduction paths of each of the transistors. This sensing is done so as to avoid the need for an additional coupling transformer. More particularly, the current flow to or from either of the terminals of the primary direct voltage supply, which current flow is in a first direction when either of the switching transistors is conductive and is in a second direction opposite to the first direction when the clamp diodes are conductive, is sensed for determining the times when the switching transistors are to begin to be conditioned for conduction. The switching transistors begin to be conditioned for conduction when the current flow is in the second direction.

19 Claims, 12 Drawing Sheets

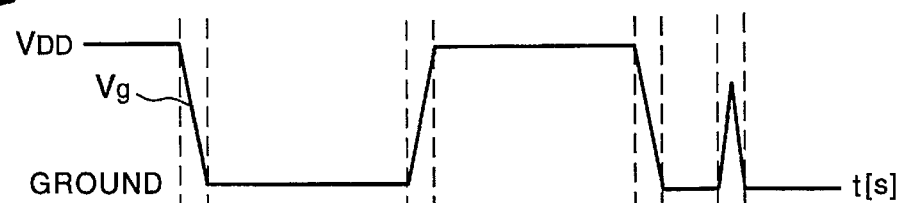
Fig. 5A
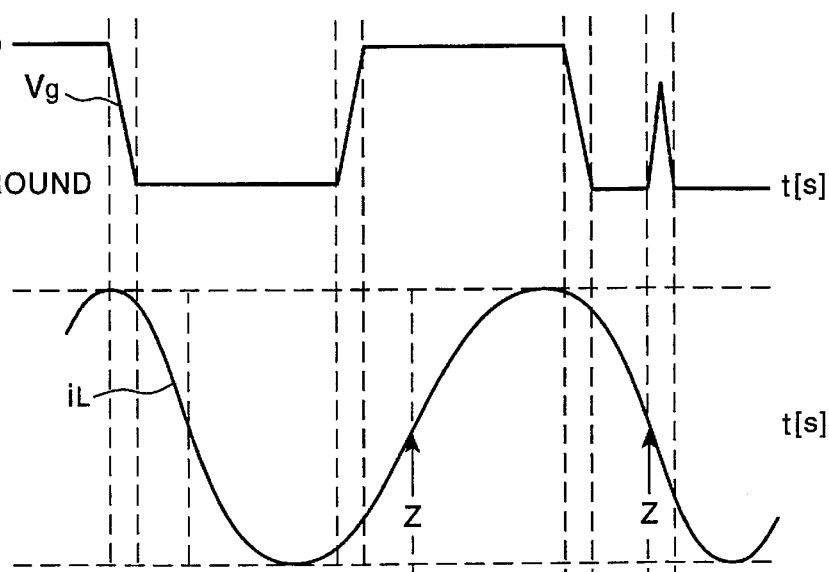
Fig. 5B
Fig. 5C
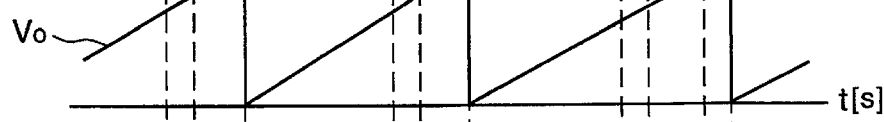
Fig. 5D
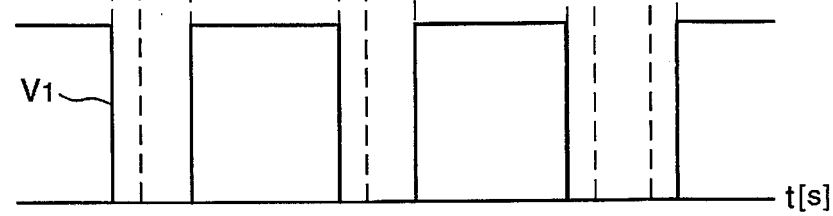

ZERO-VOLTAGE SWITCHING CIRCUITRY, AS FOR USE IN RESONANT INVERTERS

The present invention relates to resonant inverters and more particularly to switching circuitry for conditioning switching transistors therein for conduction when their principal conduction paths have substantially zero voltages thereacross, prior to the application of voltages for causing actual conduction.

BACKGROUND OF THE INVENTION

FIG. 1A shows a resonant half-bridge inverter which includes, in addition to a resonant circuit, a primary supply 4 of direct voltage $V_{DD}$, a coupling transformer $T_1$ with a primary winding and split-phase secondary windings, switching transistors $Q_1$ and $Q_2$, clamp diodes $D_1$ and $D_2$, and charge capacitors $C_1$, $C_2$, $C_3$ and $C_4$. The resonant circuit is formed from the series connection of a resonance inductor $L_r$ with a parallel connection of a resonance capacitor $C_r$ and a load resistance $R_L$. The resonant inverter is useful for high-frequency lighting using a fluorescent light or a discharge lamp, for example, with the fluorescent light or discharge lamp providing the load resistance $R_L$ and some portion of the resonance capacitor $C_r$. In such instances, the load resistance $R_L$ exhibits substantial variation caused by changing conditions in the conduction through plasma, and the resonance inductor $L_r$ provides ballasting. The primary supply 4 may be a battery of electrochemical cells, as when a fluorescent light or discharge lamp is used in emergency lighting. Alternatively, the primary supply 4 may instead comprise a rectifier for rectifying alternating voltage and a smoothing filter for converting the rectified alternating voltage to direct voltage. Such arrangement is useful, for example, for converting 60-cycle power from the electric mains to higher frequency to avoid flicker in lighting using a fluorescent light or a discharge lamp.

A switching signal appearing between terminals OUT1 and OUT2 applied to the primary winding of the transformer $T_1$ comprises, in effect, pulses that are alternately positive and negative in polarity. Respective secondary windings of the transformer $T_1$ apply this switching signal between the source and gate electrodes of the switching transistors $Q_1$, and $Q_2$, respectively, for conditioning them for alternate drain-to-source conduction with intervening intervals that neither of them is conditioned for drain-to-source conduction. The beginning of each interval when one of the switching transistors $Q_1$ and $Q_2$ is conditioned for drain-to-source conduction is timed to precede a zero-current condition in the resonance inductor $L_r$. This is so that the switching transistor comes into conduction immediately upon reversal of the polarity of its source-to-drain potential as the resonant current flowing through the resonance inductor $L_r$ builds up in polarity opposite to its previous polarity.

The capacitors $C_1$ and $C_2$ function primarily as commutating capacitors, and normally their respective capacitances are designed to be the same as each other. The capacitors $C_1$ and $C_2$ are made not to be too large in capacitance, so that losses owing to dissipation of their charge in the switching devices should switching be mis-timed does not reduce conversion efficiency of the resonant inverter too much. Normally, the respective capacitances of the capacitors $C_3$ and $C_4$ are designed to be the same as each other, as well, so that after operation is established in the resonant half-bridge inverter, the quiescent voltage at the interconnection of the charge capacitors $C_3$ and $C_4$ is essentially $V_{DD}/2$ as referred to the negative terminal of the $V_{DD}$ direct voltage supply 4.

Furthermore, the capacitances of the charge capacitors $C_3$ and $C_4$ are customarily made large enough to suppress reasonably well the ripple voltage at their interconnection. The primary supply 4 is designed to include sufficient internal resistance that the initial charging of the capacitors $C_1$, $C_2$, $C_3$ and $C_4$ proceeds slowly enough that charging currents are not excessive.

The drain-to-source conduction of the switching transistor $Q_1$ maintains the capacitor $C_1$ discharged, applies a voltage that builds up the field surrounding the winding of the inductor $L_r$ to cause an increasing positive current $i_L$ flow therethrough, and charges the capacitor $C_2$ until the direct voltage supply potential $V_{DD}$ appears between its plates. The positive current $i_L$ flows from the positive terminal of the primary supply 4 through the conductive channel of the transistor $Q_1$ (which channel is the principal conduction path of that transistor), through the inductor $L_r$, through the parallel connection of the resonant capacitor $C_r$ and the load resistor $R_L$ and returns to the negative terminal of the primary supply 4 via capacitor $C_2$. When the capacitor $C_2$ charges so the direct voltage supply potential $V_{DD}$ appears between its plates, drain-to-source conduction of the switching transistor $Q_1$ halts owing to lack of drain-to-source potential. The trailing edge of the positive pulse in the switching signal that conditions the switching transistor $Q_1$ to exhibit drain-to-source conduction is caused to occur at this time. The field surrounding the winding of the inductor $L_r$ begins to collapse, tending to maintain the demand for positive current $i_L$ flowing through the inductor $L_r$ in accordance with Lenz's Law, discharging the capacitor $C_2$ and charging the capacitor $C_1$ as the voltage $V_g$ at the node between the capacitors $C_1$ and $C_2$ falls during to a ground potential at the negative terminal of the direct voltage supply 4. The field surrounding the winding of the inductor $L_r$ continues to collapse, tending to maintain the demand for positive current $i_L$ flowing through the inductor $L_r$ in accordance with Lenz's Law, and the clamp diode $D_2$ for the switching transistor $Q_1$ is drawn into conduction until the field surrounding the winding of the inductor $L_r$ is completely collapsed and the demand for positive current $i_L$ ceases. When the demand for positive current $i_L$ ceases, the cathode of the diode $D_2$ is no longer pulled negative respective to its anode. The leading edge of the negative pulse in the switching signal that conditions the switching transistor $Q_2$ to exhibit drain-to-source conduction preferably occurs after the redistribution of charge from the capacitor $C_2$ to the capacitor $C_1$ and before free-running in the resonant circuit formed by the inductor $L_r$ and the capacitor $C_r$ begins to demand negative current $i_L$.

The drain-to-source conduction of the switching transistor $Q_2$ maintains the capacitor $C_2$ discharged, applies a voltage that builds up the field surrounding the winding of the inductor $L_r$ to cause an increasing negative current $i_L$ flow therethrough, and charges the capacitor $C_1$ until the direct voltage supply $V_{DD}$ potential appears between its plates. The negative current $i_L$ flows to the negative terminal of the primary supply 4 through the conductive channel of the transistor $Q_2$ (which channel is the principal conduction path of that transistor) from the inductor $L_r$ being drawn from the positive terminal of the primary supply 4 to the inductor $L_r$ via the capacitor $C_3$ and thence the parallel connection of the resonant capacitor $C_1$ and the load resistor $R_L$. When the capacitor $C_2$ charges so the direct voltage supply potential $V_{DD}$ appears between its plates, halts owing to lack of drain-to-source potential. The trailing edge of the negative pulse in the switching signal that conditions the switching transistor $Q_2$ to exhibit drain-to-source conduction is caused to occur at this time. The field surrounding the winding of the inductor $L_r$ begins to collapse, tending to maintain the demand for negative current $i_L$ flowing through the inductor $L_r$ in accordance with Lenz's Law, discharging the capacitor $C_1$ and charging the capacitor $C_2$ as the voltage $V_g$ at the node between the capacitors $C_1$ and $C_2$ rises during flyback to the $V_{DD}$ potential at the positive terminal of the direct voltage supply 4. The field surrounding the winding of the inductor $L_r$ continues to collapse, tending to maintain the demand for positive current $i_L$ flowing through the inductor $L_r$ in accordance with Lenz's Law, and the clamp diode $D_1$ is driven into conduction until the field surrounding the winding of the inductor $L_r$ is completely collapsed and the demand for negative current $i_L$ ceases. When the demand for negative current $i_L$ ceases, the anode of the diode $D_1$ is no longer pushed positive respective to its cathode. The leading edge of the positive pulse in the switching signal that conditions the switching transistor $Q_1$ to exhibit drain-to-source conduction preferably occurs after the redistribution of charge from the capacitor $C_1$ to the capacitor $C_2$ and before free-running in the resonant circuit formed by the inductor $L_R$ and the capacitor $C_r$ begins to demand positive current $i_L$.

FIG. 1B shows the waveform of the current $i_L$ flowing through the inductor $L_R$ Of the FIG. 1A circuit during the cycle when the switching transistors $Q_1$ and $Q_2$ are alternately conditioned to exhibit drain-to-source conduction. In FIG. 1B the time $t_0$ is that at which the switching transistor $Q_1$ is conditioned by switching signal applied between its source and gate electrodes to exhibit drain-to-source conduction. The time $t_1$ is that at which the switching transistor $Q_1$ quits conduction. The charge interval for capacitor $C_1$ and the discharge interval for capacitor $C_2$ extend for the time duration $t_{d1}$ from time $t_1$ until time $t_2$, and the interval when the diode $D_2$ is drawn into conduction extends for the time duration $t_{d2}$ from time $t_2$ until time $t_3$. The switching signal applied between the source and gate electrodes of the switching transistor $Q_2$ should begin to condition transistor $Q_2$ to exhibit drain-to-source conduction some time after time $t_2$, but no later than time $t_3$.

Applying the switching signal between the source and gate electrodes of the switching transistor $Q_2$ before time $t_2$ conditions the transistor for inverse-mode conduction before the charging of the capacitor $C_1$ and the discharging of the capacitor $C_2$ are completed so the source-to-drain voltage of transistor $Q_2$ is essentially zero before it is conditioned for conduction. Charge remaining in capacitor $C_2$ has to be dissipated by conduction through the switching transistor $Q_2$, and the charging of the capacitor $C_1$ has to be completed by drawing current from the primary supply 4 through the conductive switching transistor $Q_2$. This switching loss, and analogous switching loss when the switching transistor $Q_1$ is conditioned for drain-to-source conduction too early, undesirably reduces conversion efficiency.

In practice, the switching signal applied between the source and gate electrodes of the switching transistor $Q_2$ generally has to be applied somewhat earlier than time $t_3$, while the source-to-drain voltage of transistor $Q_2$ is essentially zero. Otherwise, capacitor $C_1$ is discharged somewhat, so its charging must be completed by drawing current from the primary supply 4 through the conductive switching transistor $Q_2$; and charge undesirably builds up in capacitor $C_2$ that has to be dissipated by conduction through the switching transistor $Q_2$. This switching loss, and analogous switching loss when the switching transistor $Q_1$ is conditioned for drain-to-source conduction too late, also undesirably reduces conversion efficiency. Undesirable glitches are introduced into the waveform of the voltage $V_g$ as well.

In the prior art the timings of the leading edges of the pulses in the switching signal applied across the primary winding of the split-phase coupling transformer $T_1$ have been inferred from the trailing edges of the immediately preceding pulses. However, the method has a practical problem that the timing of the occurrence of the zero-current condition in the resonant inductor $L_r$, as referred to the switching off of the switching transistors, varies. Variation is caused by changes in the voltage $V_{DD}$ supplied by the direct voltage supply 4 and by changes in the loading on the resonant circuit, which alter the decay time of the resonant current. Accordingly, the leading edges of the switching signal that condition the switching transistors to exhibit drain-to-source conduction have to be timed to be early enough to suit the worst-case increases in the voltage $V_{DD}$ and the worst-case heaviest loading on the resonant circuit in order to prevent the introduction of undesirable glitches into the waveform of the voltage $V_g$. The timing of the completion of charge redistribution in the capacitors $C_1$ and $C_2$ is also affected by changes in the voltage $V_{DD}$ supplied by the direct voltage supply 4 and by changes in the loading on the resonant circuit, however, so the design should try to avoid the possibility of undesirable switching loss owing to the leading edges of the switching signal being made too early during worst-case decreases in the voltage $V_{DD}$ and the worst-case reductions in loading on the resonant circuit.

There is a desire, then, for a better way to time the leading edges of the switching signal applied to the switching transistors $Q_1$ and $Q_2$ to assure that they occur during the periods of forward conduction by the diodes $D_1$ and $D_2$. Preferably, this better way is one that does not require additional coupling transformers.

In the resonant inverter of FIG. 1 the source-to-drain voltage of the switching transistor $Q_1$ is close to being zero-valued when the clamp diode $D_1$ conducts and becomes zero-valued at the time the diode $D_1$ stops conducting responsive to the resonant current $I_L$ passing through zero value to become positive in polarity. Conditioning the switching transistor $Q_1$ for conduction when its source-to-drain voltage is close to being zero-valued means that the capacitor $C_1$ in parallel with its channel is substantially discharged and conduction through the channel of transistor $Q_1$ does not dissipate substantial stored charge from the capacitor $C_1$ causing energy losses that must subsequently be replenished by drawing energy from the primary supply 4. Sensing when there is forward conduction by the diode $D_1$ provides an indication that the source-to-drain voltage of the transistor $Q_1$ is close to being zero-valued. Similarly, the source-to-drain voltage of the switching transistor $Q_2$ is close to being zero-valued when the clamp diode $D_2$ conducts and becomes zero-valued at the time the diode $D_2$ stops conducting responsive to the resonant current $I_L$ passing through zero value to become negative in polarity. Conditioning the switching transistor $Q_2$ for conduction when its source-to-drain voltage is close to being zero-valued means that the capacitor $C_2$ in parallel with its channel is substantially discharged and conduction through the channel of transistor $Q_2$ does not dissipate substantial stored charge from the capacitor $C_2$ causing energy losses that must subsequently be replenished by drawing energy from the primary supply 4. Sensing when there is forward conduction by the diode $D_2$ provides an indication that the source-to-drain voltage of the transistor $Q_2$ is close to being zero-valued. The current flow to or from either of the terminals of the primary direct voltage supply 4 is in a first direction when either of the switching transistors is conductive and is in a second direction opposite to the first direction when either of the clamp diodes is conductive. The observations in this paragraph, the inventors point out, form the basis for being able to control the leading edges of the pulses in the switching signal so that they occur when the source-to-drain voltage of the one of the switching transistors $Q_1$ and $Q_2$ being switched into conduction is substantially zero-valued.

The flow of current through the clamp diodes of a resonant inverter can be sensed without need for a further coupling transformer, the inventors point out, even though one (or both) of the switching transistors has its source electrode connected other than to one of the terminals of the primary direct voltage supply 4. The current flow to or from either of the terminals of the primary direct voltage supply 4, which current flow is in a first direction when either of the switching transistors is conductive and to the extent it exists when the clamp diodes are conductive is in a second direction opposite to the first direction, is sensed for determining the times when the switching transistors are to begin to be conditioned for conduction. The switching transistors begin to be conditioned for conduction when the current flow is in the second direction.

SUMMARY OF THE INVENTION

The invention in a general aspect thereof seeks to minimize the switching loss in a switching transistor having a principal conduction path paralleled by a capacitor and a clamp diode, the principal conduction path of the switching transistor connected for supplying current of a first polarity from a primary direct voltage supply to a resonant circuit comprising a resonant inductor and resonant capacitor, and the clamp diode connected for receiving from the resonant circuit forward current of a second polarity opposite the first polarity. A control electrode of the switching transistor is supplied a switching signal that conditions the transistor for conduction when the voltage across its principal conduction path is zero-valued, or substantially so, which avoids the switching loss caused by dissipation of charge from the capacitor in the principal conduction path of the switching transistor during conduction of current therethrough when the voltage across its principal conduction path is no longer zero-valued. The flow of forward current through the clamp diode is sensed to provide a determination when the voltage across the principal conduction path of the switching transistor is zero-valued, or essentially so, and in accordance with a principle of the invention the generation of the switching signal supplied to the control electrode of the switching transistor is predicated on that determination.

The invention in more particular aspects thereof seeks to minimize the switching loss in push-pull switching transistors in a resonant inverter or the like, by assuring the switching of each of the transistors into conduction occurs when the voltage across its principal conduction path is zero-valued, or substantially so. This is done responsive to sensing the flow of forward currents through clamp diodes connected across the principal conduction paths of each of the transistors, and preferably this sensing is done so as to avoid the need for an additional coupling transformer. More particularly the current flow to or from either of the terminals of the primary direct voltage supply, which current flow is in a first direction when either of the switching transistors is conductive and is in a second direction opposite to the first direction when the clamp diodes are conductive, can be sensed for determining the times when the switching transistors are to begin to be conditioned for conduction. The switching transistors begin to be conditioned for conduction when the current flow is in the second direction.

In certain resonant inverters embodying the invention, the current flow to or from either of the terminals of the primary direct voltage supply is through an inverse-parallel connection of first and second semiconductor rectifier diodes, and the voltage across the inverse-parallel connection being of correct polarity and of sufficient amplitude enables an alternately selected one of the switching transistors to be conditioned for conduction.

In certain other resonant inverters embodying the invention, the current flow to or from either of the terminals of the primary direct voltage supply is through low-resistance resistive element, and the voltage across the resistive element being of correct polarity and of sufficient amplitude enables an alternately selected one of the switching transistors to be conditioned for conduction.

In still other resonant inverters embodying the invention, the current flow to or from either of the terminals of the primary direct voltage supply is through an avalanche, and the voltage across the resistive element being of correct polarity and of sufficient amplitude enables an alternately selected one of the switching transistors to be conditioned for conduction.

A slight delay may be introduced into the enablement of an alternately selected one of the switching transistors to be conditioned for conduction, so enablement is moved closer to the time zero-crossings occur in the resonant current.

BRIEF DESCRIPTION OF THE DRAWING

The above objects and advantages of the present invention will become more apparent by describing in detail preferred embodiments thereof with reference to the attached drawings in which:

FIGS. 5A–5D show waveforms occurring in the case of the wrong operation of a zero-voltage switching;

DETAILED DESCRIPTION OF THE INVENTION

Figure 1A:
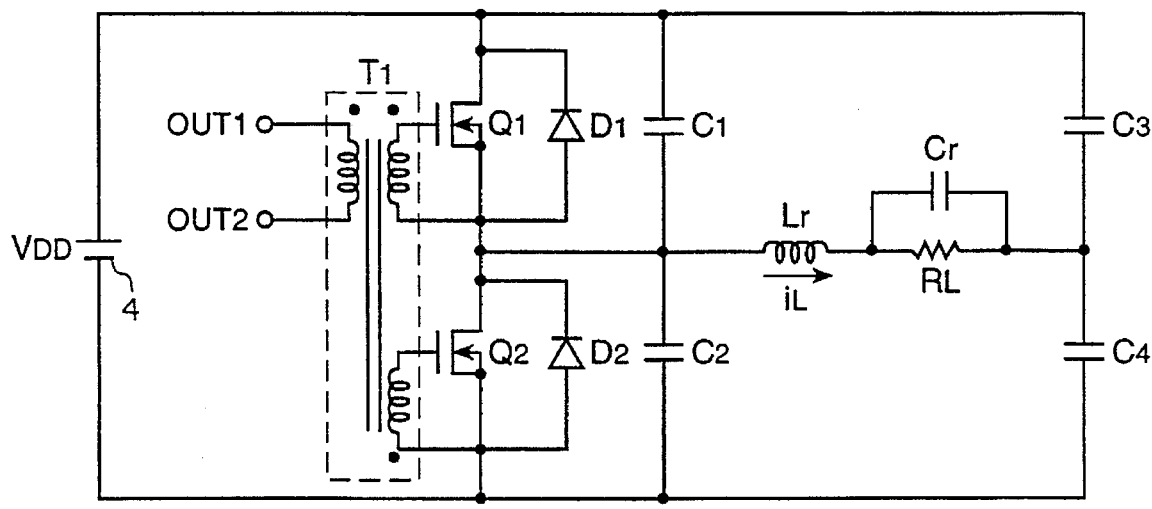
FIG. 1A is a circuit diagram showing a conventional resonant half-bridge inverter.
Figure 1B:
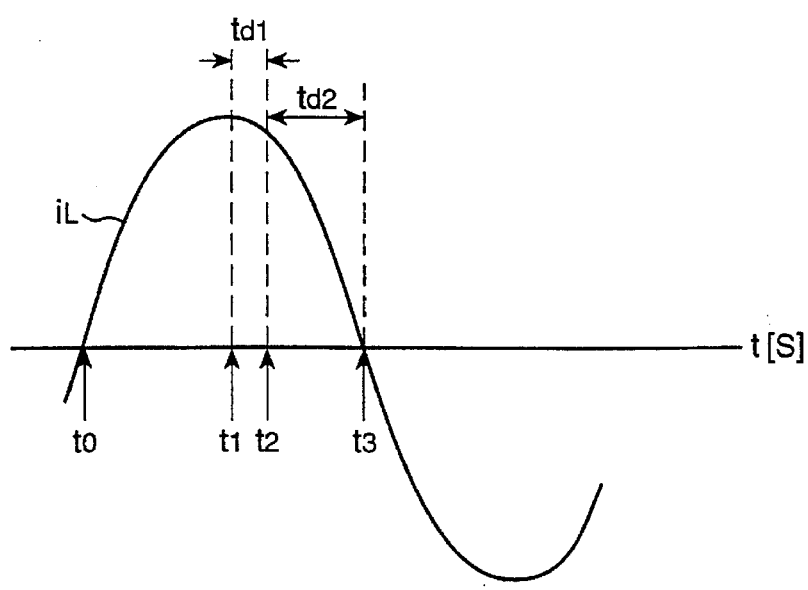
FIGURE 1B shows the waveform of a load current $i_L$ of the resonant half-bridge inverter shown in FIG. 1A.
Figure 2:
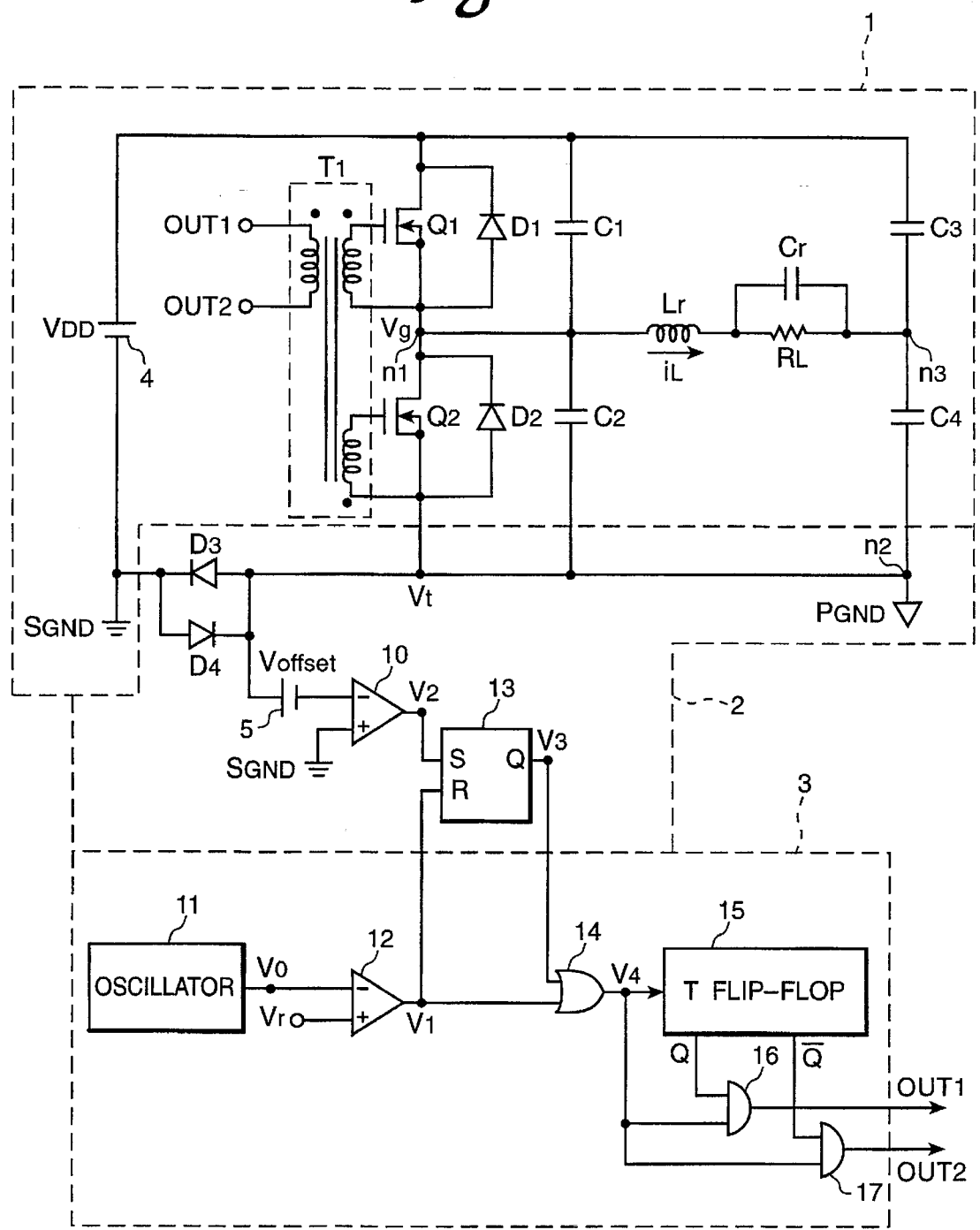
FIG. 2 is a circuit diagram of a resonant half-bridge inverter that is a first embodiment of the invention.

FIG. 2 is a circuit diagram of a first embodiment of the invention comprising a resonant inverter 1, circuitry 2 for sensing conduction by either of the clamp diodes $D_1$ and $D_2$, and switch driver circuitry 3 controlled by the circuitry 2 for driving the switching transistors $Q_1$ and $Q_2$ in the resonant inverter 1 into alternate conduction. The resonant inverter 1 differs from the conventional resonant inverter shown in FIG. 1 in that the negative terminal of the direct-voltage primary supply 4 connects to a signal ground $S_{GND}$ which differs from a power ground $P_{GND}$ to which interconnected plates of charge capacitors $C_2$ and $C_4$, the source electrode of the switching transistor $Q_2$, and the anode of the diode $D_2$ all connect.

The circuitry 2 for sensing conduction by either of the clamp diodes $D_1$ and $D_2$ includes a diode $D_3$ with anode connected to the power ground $P_{GND}$ and cathode connected to the signal ground $S_{GND}$, a diode $D_4$ with cathode connected to the power ground $P_{GND}$ and with anode connected to the signal ground $S_{GND}$, a source 5 of offset voltage $V_{offset}$ connected at its positive terminal to the power ground $P_{GND}$, a voltage comparator 10 having an inverting input connected to the negative terminal of the offset voltage source 5 and a non-inverting input connected to the signal ground $S_{GND}$, and an RS flip-flop 13 a set port of which has the output of the comparator 10 connected thereto.

(The order in which the source 5 of offset voltage $V_{offset}$ and the differential input circuit of the comparator are serially connected can be interchanged, supposing the comparator design is such as to still permit the voltage $V_2$ to be brought close to signal ground $S_{GND}$. That is, alternatively, $V_f$ can be applied directly to the inverting input of the comparator 10, and the non-inverting input of the comparator 10 can be biased from the positive terminal of a source of offset voltage $V_{offset}$ that has its negative terminal connected to signal ground $S_{GND}$.)

The switch driver circuitry 3 includes a sawtooth oscillator 11; a voltage comparator 12 having an inverting input to which an output signal $V_O$ of oscillator 11 is applied, a non-inverting input to which a reference voltage $V_r$ is applied and an output for applying an output signal $V_1$ to the reset port of RS latch 13; an OR gate 14 for logically summing an output signal $V_3$ of RS latch 13 and an output signal $V_1$ of the comparator 12 to generate a voltage $V_4$, a triggered (T) flip-flop 15 for receiving the output of OR gate 14 and acting as a frequency divider, an AND gate 16 generating output signal OUT1 in response to $V_4$ and the "true" output of the T flip-flop 15, and an AND gate 17 generating output signal OUT2 in response to $V_4$ and the "not-true" output of the T flip-flop 15. Alternatively, in an equivalent circuit that can replace AND gates 16 and 17, a first NAND gate is used for generating output signal OUT1 in response to $V_4$ and the "not-true" output of the T flip-flop 15, and a second NAND gate is used for generating output signal OUT2 in response to $V_4$ and the "true" output of the T flip-flop 15. Applying the pulses in the output waveform of the comparator 12 alternately to the OUT1 and OUT2 terminals of the transformer 1 primary winding, while the other of the OUT1 and OUT2 terminals is grounded, avoids direct current flow in the primary winding. Such arrangements are simpler than push-pull driving arrangements that have balanced power supplies or driving arrangements that have direct-current blocking capacitors in series with the primary windings of coupling transformers.

The sawtooth oscillator 11 oscillates at a predetermined rate close to twice the resonant frequency of the resonant circuit formed by the inductor $L_r$ and the capacitor $C_r$. The sawtooth oscillator 11 is often constructed as a relaxation oscillator, in which a capacitor is charged relatively slowly at a prescribed rate until a prescribed voltage appears thereacross, at which time the capacitor is rapidly discharged (e.g., by causing a switch between its plates to conduct and dissipate the charge as heat). Where the oscillator 11 is not included in an automatic frequency control (AFC) feedback loop, better frequency stability can be achieved by using a clock oscillator generating sinusoidal oscillations stabilized by a crystal or an anti-resonant tank, cyclically counting the oscillations with a counter, and decoding selected portions of the count to generate an output voltage corresponding to $V_1$. Other pulse generators, as known in the art, rather than either of the alternatives described, can be used for supplying pulses to reset RS latch 13.

Figure 3:
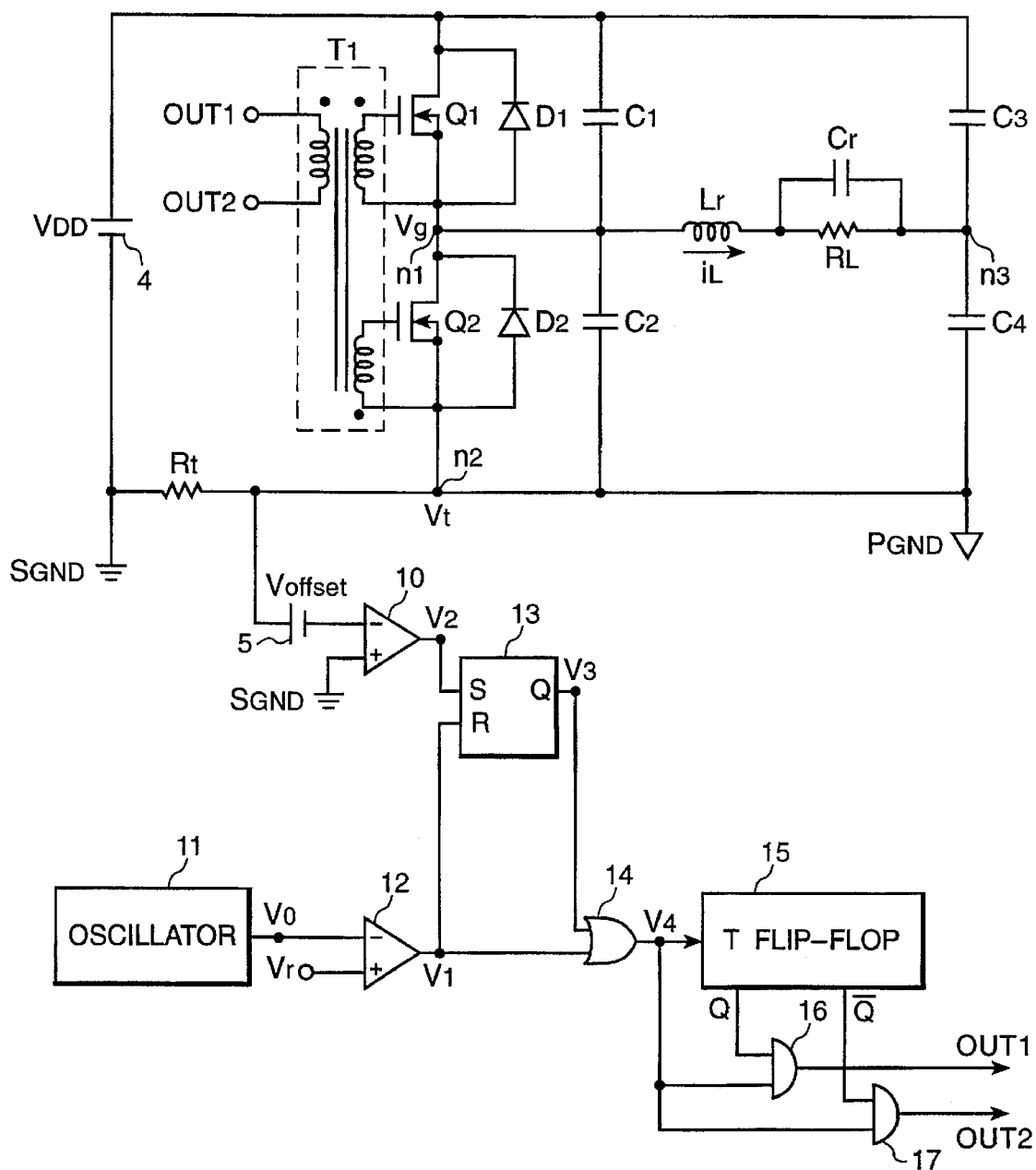
FIG. 3 is a circuit diagram of a resonant half-bridge inverter that is a second embodiment of the invention.

FIG. 3 is a circuit diagram of a second embodiment of the invention differing from the first embodiment of the invention shown in FIG. 2 in that the diodes $D_1$ and $D_2$ are replaced by a resistor $R_t$ connected between signal ground $S_{GND}$ and power ground the positive terminal of offset voltage source 5 to signal ground $S_{GND}$ and to power ground $P_{GND}$.

Figure 4:
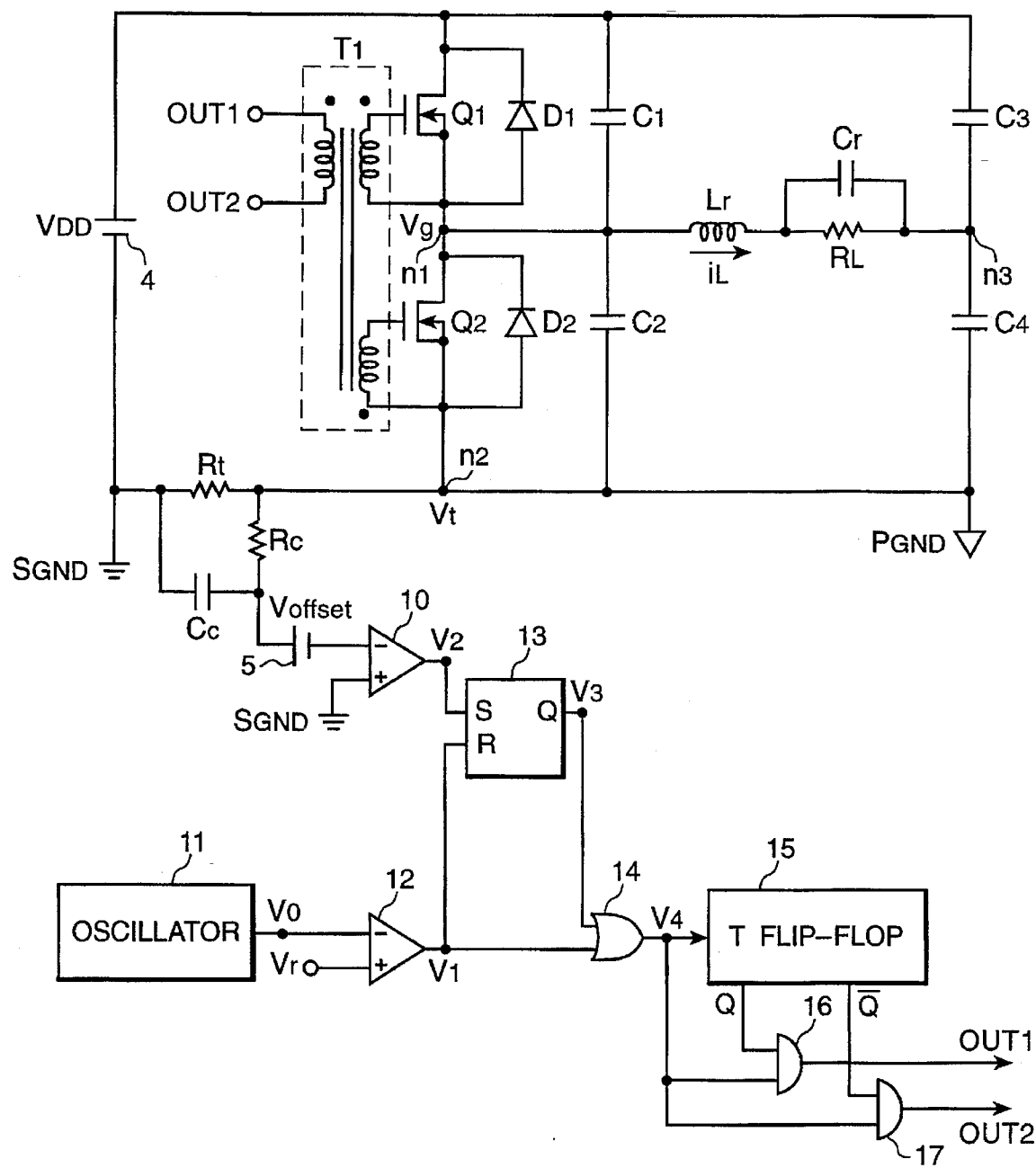
FIG. 4 is a circuit diagram of a resonant half-bridge inverter that is a third embodiment of the invention.

FIG. 4 is a circuit diagram of a third embodiment of the invention that modifies the second embodiment of the invention shown in FIG. 3, to include a capacitor $C_c$ and resistor $R_c$ respectively connecting the positive terminal of offset voltage source 5 to signal ground $S_{GND}$ and to power ground $P_{GND}$, rather than the positive terminal of offset voltage source 5 connecting directly to power ground $P_{GND}$. The resistor $R_c$ and the capacitor $C_c$ form a lowpass filter that provides some delay in turning on the switching transistors $Q_1$ and $Q_2$. Similar delaying arrangements can be used to modify the FIG. 2 embodiment of the invention.

FIGS. 5A–5D shows example waveforms for the case of a malfunctioning zero-voltage switching operation. FIG. 5A shows a voltage $V_g$ of a first interconnection node $n_1$ between switching transistors $Q_1$ and $Q_2$. FIG. 5B shows the waveform of a current $i_L$ which flows through the inductor $L_r$. FIG. 5C also shows the waveform of the output signal $V_O$ of an oscillator. FIG. 5D shows the output waveform of the comparator 12. In the prior art the transformer driver 16 applied the pulses in the output waveform of the comparator 12 alternately to the OUT1 and OUT2 terminals of the transformer 1 primary winding, while the other of the OUT1 and OUT2 terminals was grounded.

Referring to FIG. 2 showing a resonant inverter embodying the invention, consider a logic ZERO being applied to the OR gate 14 instead of the voltage $V_3$ shown. Such modification causes the operation of the FIG. 2 resonant inverter to emulate operation of the prior art circuit. Now, referring to FIGS. 5A–D, the faulty operation of zero-voltage switching that is caused by such modification will be described.

To assure zero-voltage switching, switching transistors $Q_1$ and $Q_2$ must be turned on while their respective clamp diodes are conductive before a current $i_L$ in the waveform of FIG. 5B passes through a zero point Z. During the earlier of the sawtooth oscillations shown in FIG. 5C this occurs. However, during the last of the sawtooth oscillations shown in FIG. 5C, the switching transistor $Q_2$ is turned on after current $i_L$ passes through zero point Z. This permits undesirable recharging of the capacitor $C_2$ and discharging of the capacitor $C_1$ after current $i_L$ passes through zero point Z, causing a undesirable spike in the voltage $V_g$ commonly called a "glitch". When the switching transistor $Q_2$ is turned on, it discharges the capacitor $C_2$, dissipating the energy contained in the charge as heat; and the resultant energy loss must be supplied via the switching transistor $Q_2$ from the primary supply 4 in order to bring the capacitor $C_1$ up to full charge. The dissipation of energy required of switching transistor $Q_2$ stresses the device. If the subsequent sawtooth oscillation after those shown in FIG. 5C turns the switching transistor $Q_1$ on after current $i_L$ passes through its next zero point Z, it experiences similar problems, having to dissipate charge in the capacitor $C_1$ and having to bring the capacitor $C_2$ up to full charge.

Referring to FIGS. 6A–6I, circuitry 2 for sensing conduction by either of the clamp diodes $D_1$ and $D_2$, and switch driver circuitry 3 controlled by the circuitry 2 for driving the switching transistors $Q_1$ and $Q_2$ in the resonant inverter 1 into alternate conduction will be described.

Figure 6A:
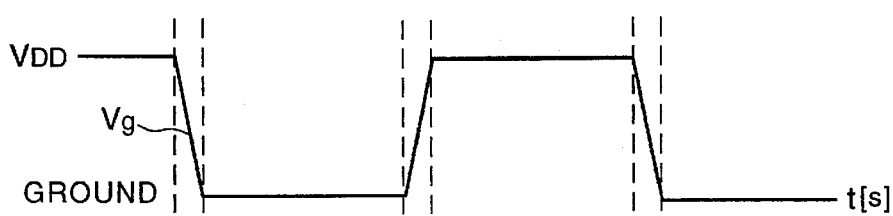
FIGS. 6A–6I show output waveforms of each portion in the operation of a resonant half-bridge inverter constructed in accordance with the invention.

FIG. 6A shows the waveform of a voltage $V_g$ of the first interconnection node $n_1$ between switching transistors $Q_1$ and $Q_2$. When a voltage $V_g$ rises and falls between supply voltage $V_{DD}$ and ground voltage Ground by the operation of switching transistors $Q_1$ and $Q_2$, a resonant inductor $L_r$ and a resonant capacitor $C_r$ resonate.

Figure 6B:
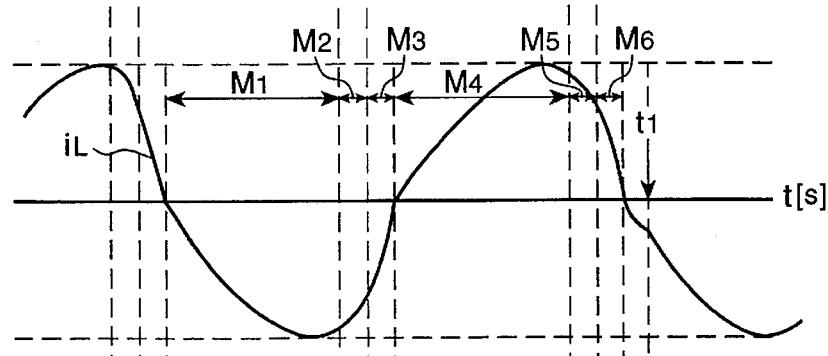

FIG. 6B shows the waveform of a current $i_L$ which flows through the inductor $L_r$.

In an interval M1, switching transistor $Q_2$ is turned on while switching transistor $Q_1$ remains turned off, which clamps to a low level the voltage $V_g$ of the first interconnection node $n_1$ between switching transistors $Q_1$ and $Q_2$. Current flow is from the positive terminal of the primary supply 4 through the capacitor $C_3$, the resonant circuit, the switching transistor $Q_2$, and the diode $D_3$ to the negative terminal of the primary supply 4. At this time, voltage $V_t$ at the node $n_2$ connected to power ground $P_{GND}$ is $V_{D3}$. ($V_{D3}$ is a forward-conduction voltage of diode $D_3$, which is about 0.7 V.)

The switching transistor $Q_2$ is turned off at the boundary between the interval M1 and an immediately following interval M5 of free-running. During the interval M2 capacitor $C_1$ discharges and capacitor $C1_1$ charges and the voltage $V_g$ of the node $n_1$ between the switching transistors $Q_1$ and $Q_2$ rises to a high level. The voltage $V_t$ at a node $n_2$ connected to a power ground $P_{GND}$ remains essentially a zero voltage respective to the signal ground $S_{GND}$.

In an interval M3, since voltage $V_g$ of the connection between switching transistors $Q_1$ and $Q_2$ is a high level, diode $D_1$ is turned on to conduct the continuing current from the inductor $L_r$. The current to support the forward conduction of diode $D_1$ flows through the third node $n_3$ from the capacitor $C_4$ and through the resonant circuit. The current flows to the positive terminal of the primary supply 4, through the primary supply 4 as a voltage-translating element and out its negative terminal to forward bias the diode $D_4$ into forward conduction as the current completes its loop return to the capacitor $C_4$. At this time, then, voltage $V_t$ applied to power ground $P_{GND}$ is $-V_{D4}$. ($V_{D4}$ is a forward-conduction voltage of diode $D_4$, which is about 0.7 V.)

In an interval M4, switching transistor $Q_1$ is turned on while switching transistor $Q_2$ remains turned off, causing the voltage $V_g$ at the first interconnection node $n_1$ between switching transistors $Q_1$ and $Q_2$ to be high in level. Current flows from the positive $V_{DD}$ terminal of the primary direct voltage supply 4 through the conductive switching transistor $Q_1$, through the resonant circuit and the capacitor $C_4$, and thence to the negative terminal of the supply 4 through the diode $D_3$, forward biasing $D_3$ into conduction. At this time, voltage $V_t$ applied at the node $n_2$ connected to power ground $P_{GND}$ is again $V_{D3}$.

The switching transistor $Q_1$ is turned off at the boundary between the interval M4 and an immediately following interval M5. M5 is an interval of free-running during which capacitor $C_2$ discharges and capacitor $C_1$ charges and the voltage $V_g$ of the node $n_1$ between the switching transistors $Q_1$ and $Q_2$ falls to a low level. The voltage $V_t$ at a node $n_2$ connected to a power ground $P_{GND}$ becomes essentially a zero voltage respective to the signal ground $S_{GND}$.

In an interval M6, during which voltage $V_g$ of the connection point between switching transistors $Q_1$ and $Q_2$ remains at a low level, diode $D_2$ turns on to conduct the continuing current into the inductor $L_r$. The current to support the forward conduction of diode $D_2$ flows from the higher potential supplied by the capacitor $C_3$ to the positive terminal of the primary supply 4, through the primary supply 4 as a voltage-translating element and out its negative terminal, and forward biases the diode $D_4$ into forward conduction. At this time, voltage $V_t$ at the node $n_2$ connected to power ground $P_{GND}$ is again $-V_{D4}$.

Figure 6C:
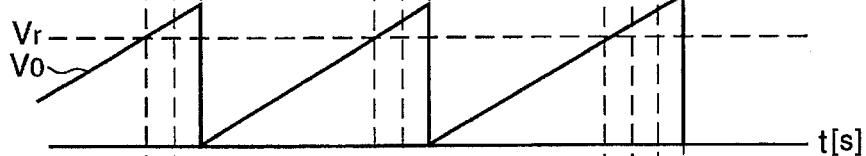

FIG. 6C shows the sawtooth waveform of an output signal voltage $V_O$ supplied from the oscillator 11. Note that the rightmost sawtooth of the output signal voltage $V_O$ extends beyond the time that the inductor $L_r$ current $i_L$ crosses through zero in FIG. 6B, giving rise to the problem solved by the invention.

Figure 6D:
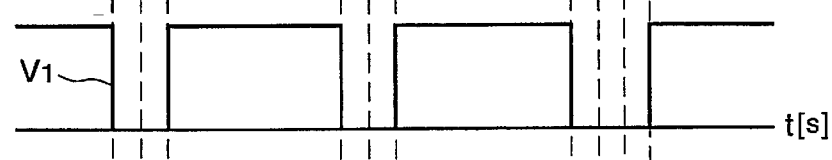

FIG. 6D shows the waveform of an output signal voltage $V_1$ of the comparator 12. The comparator 12 compares an output signal $V_O$ of the oscillator with a reference voltage $V_r$, supplying a high signal when voltage $V_O$ is lower than reference voltage $V_r$ and supplying a low signal when voltage $V_O$ is higher than voltage $V_r$. FIG. 6D also shows how the rightmost sawtooth of the output signal $V_O$ in FIG. 6C being too extended delays the rightmost low-to-high transition in the output signal $V_1$ of the comparator 12. This would delay the corresponding transition in the drive signal OUT2 in the prior art.

Figure 6E:

FIG. 6E shows the waveform of an output signal voltage $V_2$ of the comparator 10, which supplies a high signal when voltage $V_t$ falls below the offset voltage $V_{offset}$. The comparator 10 output voltage is high responsive to the voltage drop across $D_4$ as it conducts the current needed to supply the inductor $L_r$ current $i_L$ when one of the diodes $D_1$ and $D_2$ is conductive.

Figure 6F:

FIG. 6F shows the waveform of the "true" output voltage $V_3$ of the RS latch 13, which is set "high" in response to the leading edge of each positive pulse in the output signal voltage $V_2$ of the comparator 10, and which is reset "low" in response to the leading edge of each positive pulse in the output signal voltage $V_1$ of the comparator 12. When the falling edge of a sawtooth oscillation occurs concurrently with the falling edge of an output signal voltage $V_2$ pulse, which normally is the case, the output voltage $V_3$ of the RS latch 13 exhibits pulses similar to those in the output signal voltage $V_2$ of the comparator 10. When the falling edge of a sawtooth oscillation occurs later than the falling edge of an output signal voltage $V_2$ pulse, the output voltage $V_3$ of the RS latch 13 exhibits pulses of extended duration. Such an extension of the duration of the rightmost pulse of the output voltage $V_3$ is cross-hatched in FIG. 6F. This pulse extension is used to prevent erroneously turning off the switching transistor $Q_2$, which would undesirably permit a positive-going glitch to appear in the voltage $V_g$ at the first interconnection node $n_1$ between switching transistors $Q_1$ and $Q_2$.

Figure 6G:

FIG. 6G shows the waveform of an output signal voltage $V_4$ of the OR gate 14, which receives the output signal voltage $V_1$ of the comparator 12 and the "true" output voltage $V_3$ of the RS latch 13 as its two input signals. Since the RS latch 13 is set "high" until the output signal voltage $V_1$ of the comparator 12 goes "high" to reset the RS latch 13 in response thereto, the output signal voltage $V_4$ of the OR gate 14 will go "high" when the RS latch 13 is set "high" and will remain "high" until the comparator 12 output signal voltage $V_1$ subsequently goes "low". The waveform shown in FIG. 6G accordingly has its duty increased by +D.

Figure 6H:
Figure 6I:

FIGS. 6H and 6I show waveforms of output signal OUT1 and output signal OUT2 supplied from the transformer driver 16 in amplified response to alternate ones of the positive pulses in the output signal voltage $V_4$ of the OR gate 14 shown in FIG. 6G. The T flip-flop 15 is triggered by the falling edges of the comparator 10 output signal voltage $V_4$ and functions as a frequency divider. The AND gate 16 responds to $V_4$ and the "true" output of the T flip-flop 15 to generate the output signal OUT1 shown in FIG. 6H, and the AND gate 17 responds to $V_4$ and the "not-true" output of the T flip-flop 15 to generate the output signal OUT2 shown in FIG. 6I.

When a current $i_L$ rises too rapidly in intervals M2 and M3, or falls too rapidly in intervals M5 and M6, so a discharging time $t_1$ of a sawtooth waveform appears after a current $i_L$ passes through a zero point, an output operation signal turning on switching transistors $Q_1$ and $Q_2$ tends to be delayed to cause wrong operation of the zero-voltage switching. Accordingly, to avoid the wrong operation of the zero-voltage switching, a circuitry 2 for sensing conduction by either of the clamp diodes $D_1$ and $D_2$ detects a state of a voltage $V_t$ and then turns on switching transistors $Q_1$ and $Q_2$ at the time when diode $D_4$ is turned on. That is, switching transistors $Q_2$ and $Q_1$ are switched into conduction at the beginning of interval M3 and at the beginning of interval M6, respectively, in order always to perform the switching operation when the voltage $V_g$ is zero. This avoids power loss in the switching operation.

Figure 7:
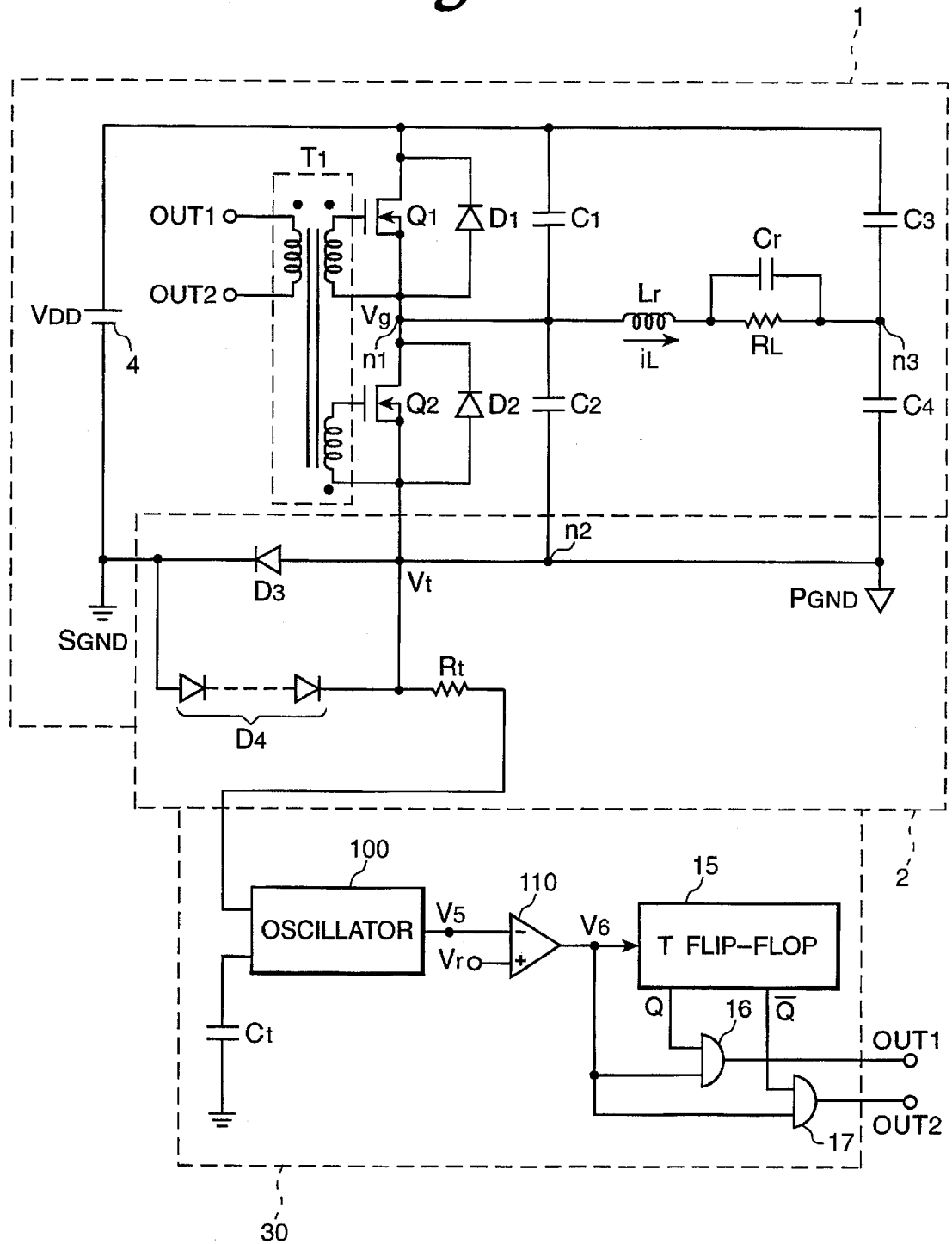
FIG. 7 is a circuit diagram of a resonant half-bridge inverter that is a fourth embodiment of the invention.

FIG. 7 is a circuit diagram of a resonant inverter including zero-voltage switching circuitry according to a fourth embodiment of the invention that differs from the FIG. 2 first embodiment of the invention in the following respects, although the same resonant inverter 1 is used in both embodiments.

In the FIG. 7 switch driver circuitry 30, the fixed-rate sawtooth oscillator 11 of the FIG. 2 switch driver circuitry 3 is replaced by a controlled-rate sawtooth oscillator 100. The voltage comparator 12 and the OR gate 14 are dispensed with, as well as connections to the RS latch 13. Instead, a voltage comparator 110 compares the output voltage $V_5$ of the controlled-rate sawtooth oscillator 100 with a reference voltage $V_r$ to generate a voltage $V_6$ comprising a train of pulses. The T flip-flop 15 is triggered by the falling edges of these pulses and still functions as a frequency divider. The AND gate 16 responds to $V_6$ and the "true" output of the T flip-flop 15 to generate the output signal OUT1 responsive to alternate ones of the $V_6$ voltage pulses, and the AND gate 17 responds to $V_4$ and the "not-true" output of the T flip-flop 15 to generate the output signal OUT2 responsive to the intervening $V_6$ voltage pulses. The controlled-rate sawtooth oscillator 100 has a charging period during which a capacitor $C_t$ associated therewith is charged by current of a value corresponding to a control current applied to a terminal of the oscillator 100 held close in potential to its positive operating supply, which typically is a few volt (e.g. 5 V.) supply. Typically, the oscillator 100 is constructed using a monolithic integrated circuit, with the capacitor $C_t$ charged from the output connection of a current mirror amplifier that receives the applied control current at its input connection and has its common connection to the positive operating supply of the oscillator 100 The duration of the charging period is determined by the capacitance of the capacitor $C_t$ and the value of the applied control current.

The circuitry 20 for sensing conduction by either of the clamp diodes $D_1$ and $D_2$ shown in FIG. 7 dispenses with the offset voltage supply 5, the comparator 10 and the RS latch 13 of the FIG. 2 circuitry 2 for sensing conduction by either of the clamp diodes $D_1$ and $D_2$. The voltage $V_t$ at the node $n_2$ is applied to a resistor $R_t$ for generating the applied current that controls the charging slope of the sawtooth generated by the sawtooth oscillator 100 and thus controls the duration of the sawtooth. The single diode $D_4$ may be replaced by a series connection of diodes, so the charging slope of the sawtooth generated by the sawtooth oscillator 100 is affected in more pronounced way when either of the clamp diodes $D_1$ and $D_2$ conduct.

Figure 12:
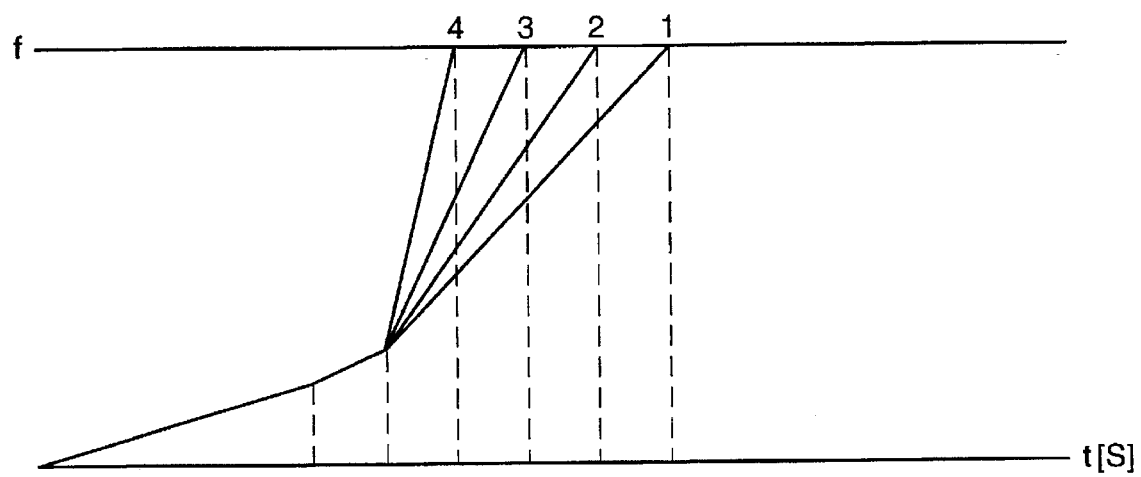
FIG. 12 is a graph showing the effect of the number of diodes in the circuitry for sensing conduction by either of the clamp diodes in the circuitry for sensing conduction by either of the clamp diodes in the FIG. 7 resonant half-bridge inverter upon the charging of the capacitor in a sawtooth oscillator therein.

FIG. 12 is a graph showing the variation of charge slope in the FIG. 7 oscillator 100 according to the number of diodes $D_4$. In FIG. 12, four different plots show the cases where the number of diodes $D_4$ decreases from one up to four. The sensitivity of charge slope change that is available is determined by adjusting the number of diodes $D_4$. That is, a value of a voltage $V_t$ is changed according to the number of diodes and the quantity of a current flowing through a resistor $R_t$ is changed according to the voltage value. Consequently, the difference of the quantity of a current leads to the difference between normal charge current and accelerated charge current of the capacitor $C_t$ connected to an oscillator. Thus, current variations result in frequency variations according to $f=I/(CV)$. That is, the increase of the number of diodes leads to increased current through a resistor $R_t$. Accordingly, the average charge current of capacitor $C_t$ is increased, so that the resonant frequency is increased.

Lowering the positive operating supply for the controlled-rate sawtooth oscillator 100, or otherwise reducing the potential at which the control terminal of the oscillator is held, are alternative ways to increase the effect upon the charging slope of the oscillator 100 of either of the clamp diodes $D_1$ and $D_2$ conducting.

Figure 8:
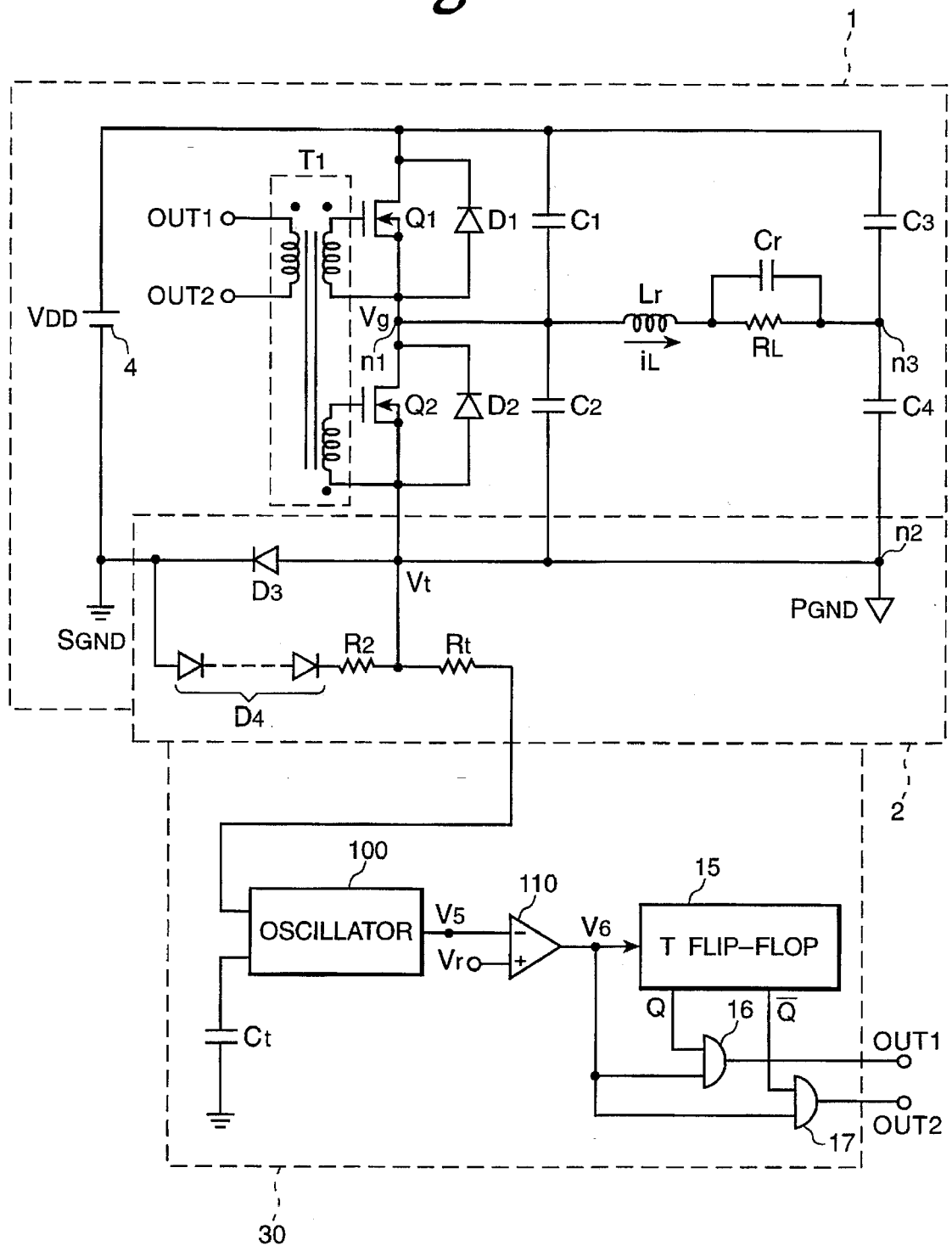
FIG. 8 is a circuit diagram of a resonant half-bridge inverter that is a fifth embodiment of the present invention.

FIG. 8 is a circuit diagram of a resonant inverter including zero-voltage switching circuitry according to a fifth embodiment of the invention. It modifies the FIG. 7 fourth embodiment of the invention in that a resistor $R_2$ is connected in series with the diode(s) $D_4$.

Figure 9:
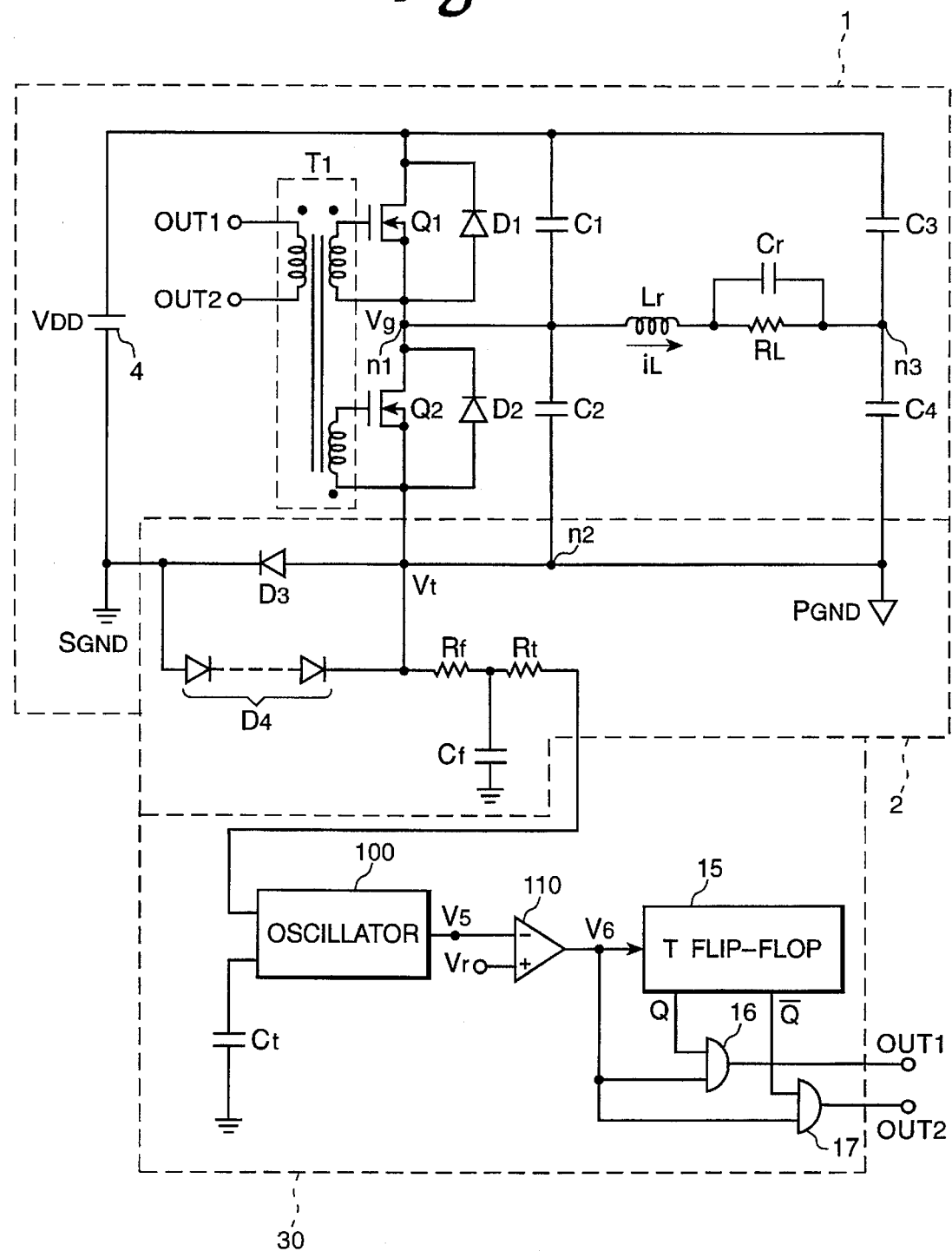
FIG. 9 is a circuit diagram of a zero-voltage switching circuit according to a sixth embodiment of the invention.

FIG. 9 is a circuit diagram of a resonant inverter including zero-voltage switching circuitry according to a sixth embodiment of the invention. It modifies the FIG. 7 fourth embodiment of the invention in that the resistor $R_t$ is replaced by a serial connection of resistors $R_f$ and $R_r$, with a capacitor $C_f$ bypassing to ground the interconnection between resistors $R_f$ and $R_r$. The resistor $R_f$ and the capacitor $C_f$ form a lowpass filter that make the feedback control of the controlled-rate sawtooth oscillator 100 more stable.

Figure 10:
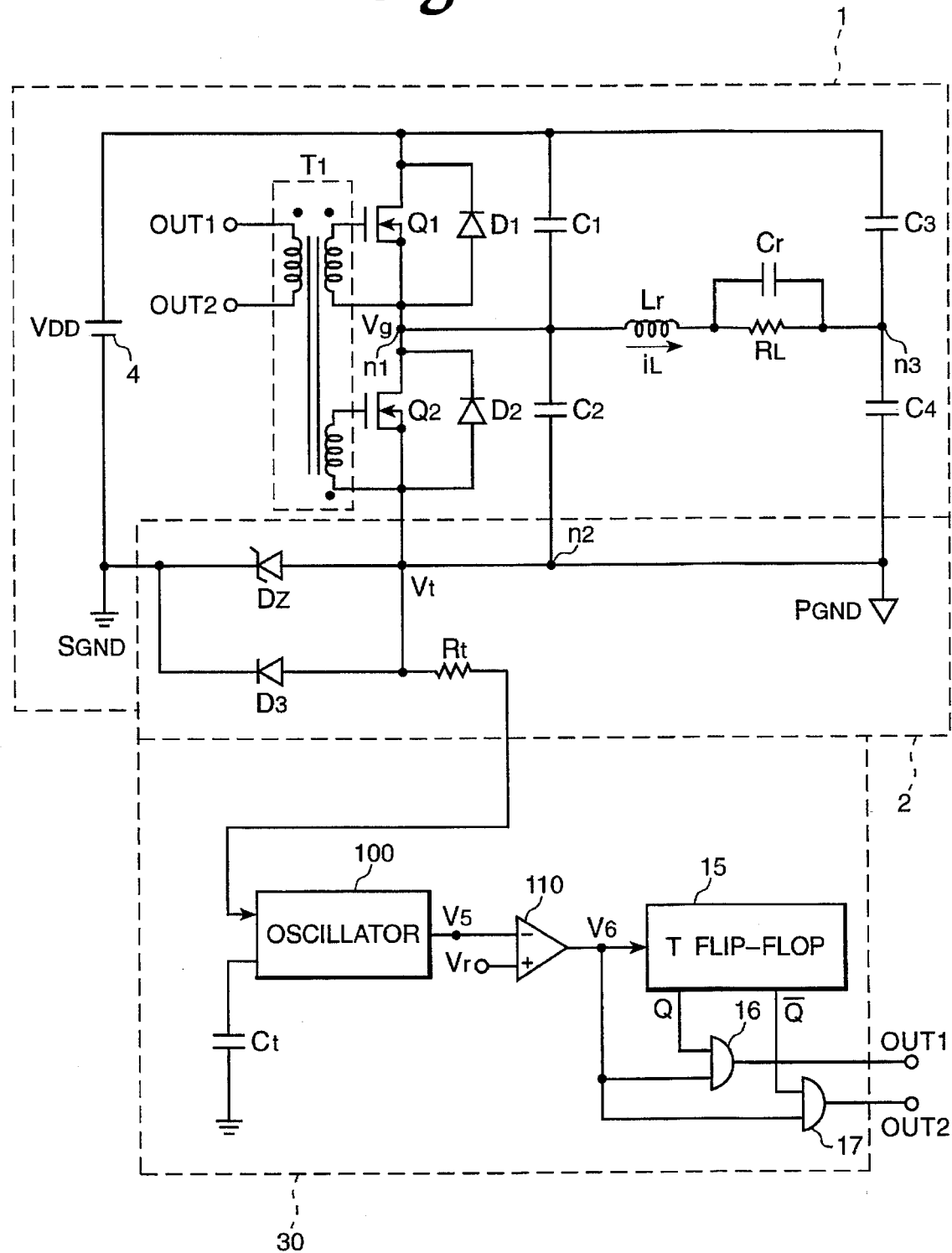
FIG. 10 is a circuit diagram of a resonant half-bridge inverter that is a seventh embodiment of the invention.

FIG. 10 is a circuit diagram of a resonant inverter including zero-voltage switching circuitry according to a seventh embodiment of the invention. It modifies the FIG. 7 fourth embodiment of the invention in that the diode(s) $D_4$ are replaced by a Zener or avalanche diode $D_z$ poled for reverse conduction of the current that flows when either of the clamp diodes $D_1$ and $D_2$ conduct. During such reverse conduction the reverse voltage across the diode $D_z$ is constrained to a voltage $V_{zener}$. The forward conduction of the diode $D_z$ generally suffices to carry the forward current flowing when either of the switching transistors $Q_1$ and $Q_2$ is conductive. Accordingly, the diode $D_3$ can be dispensed with unless operating frequency of the resonant converter is so high that the time delay associated with changing the mode of conduction through the diode $D_z$ is significant.

FIGS. 11A–11F show waveforms occurring in the operation of the resonant inverter including zero-voltage switching circuitry shown in FIG. 7.

Figure 11A:
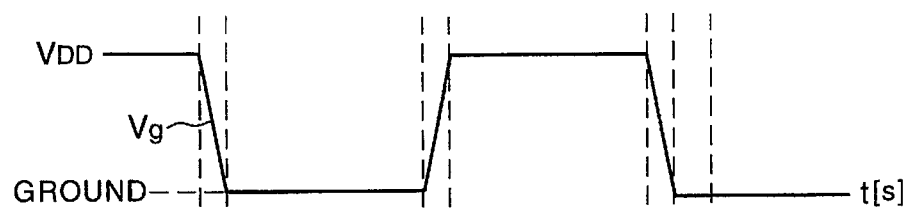
FIGS. 11A–F show waveforms occurring in the operation of the resonant half-bridge inverter shown in FIG. 7.
Figure 11B:
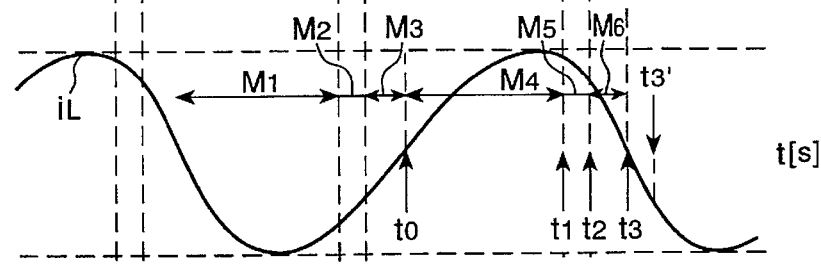
Figure 11C:
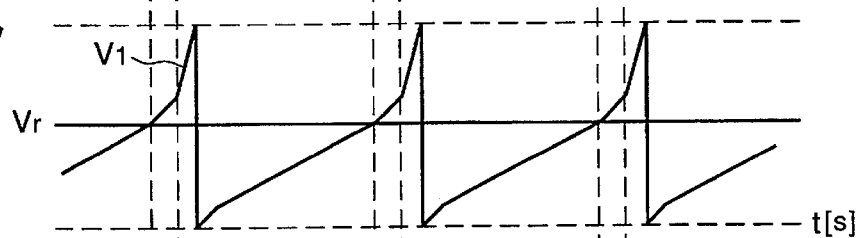
Figure 11D:
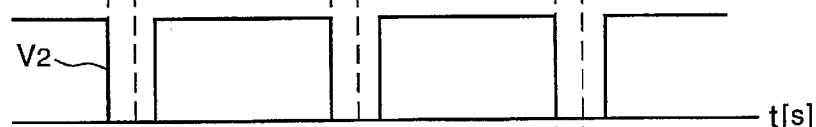
Figure 11E:
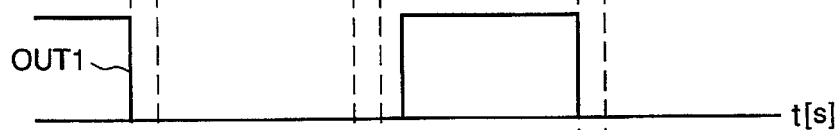
Figure 11F:
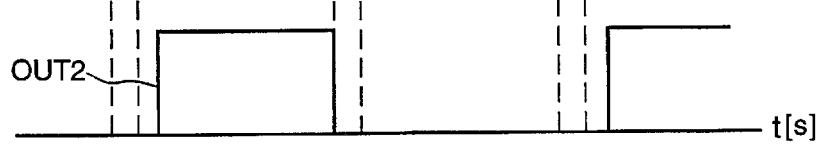

FIG. 11A shows a waveform of a voltage $V_g$ of the node $n_1$ at the connection point between switching transistors $Q_1$ and $Q_2$. FIG. 11B shows a waveform of a current $i_L$ flowing through the inductor $L_r$. FIG. 11C shows the waveform of an output signal $V_5$ of the oscillator 100, FIG. 11D the waveform of an output signal $V_6$ of the comparator 110, FIG. 11E the waveform of an output signal OUT1 of the AND gate 16, and FIG. 11F the waveform of an output signal OUT2 of the AND gate 17. The operation of the resonant inverter including zero-voltage switching circuitry shown in FIG. 7 will now be more particularly described, referring to FIGS. 11A–F.

When the current $i_L$ shown in FIG. 7 falls in intervals M5 and M6, as shown in FIGS. 6B and 6C, if a discharging time $t_1$ of a sawtooth waveform appears after current $i_L$ passes through a zero point, an output operation signal turning on switching transistors $Q_2$ would be delayed to cause incorrect operation of zero-voltage switching. To prevent this from occurring, the charging of the capacitor $C_t$ is accelerated once the diode $D_1$ conducts to cause forward conduction of the diode(s) $D_4$. Accordingly, switching transistor $Q_2$ is turned on earlier in the interval M3 in order that the operation of switching is performed on the condition that a voltage $V_g$ of the connection between switching transistors $Q_1$ and $Q_2$ is zero, achieving switching operation having no power loss.

Now, referring to FIGS. 11A–F, the operation of a zero-voltage switching circuit by each interval will be described.

In an interval M4 when a switching transistor $Q_1$ is turned on so the diode $D_3$ is forward conduction, a voltage $V_t$ is a forward voltage $V_{D4}$ of diode $D_3$ and the current $I_1$ flowing through a resistor $R_t$ is calculated as $$I_1 = (V_{ref} - V_{D3})/R_t.$$

In an interval M5, voltage $V_t$ free-runs to an interval when capacitors $C_1$ and $C_2$ are charged and discharged and then becomes zero voltage. The current $I_2$ flowing through a resistor $R_t$ is calculated as $$I_1 = (V_{ref} - 0)/R_t.$$

In an interval M6 when each diode $D_4$ is in forward conduction to have a forward voltage $V_D$ thereacross, voltage $V_t$ is $(N+1)V_D$ and the current $I_3$ flowing through a resistor $R_t$ is calculated as $$I_1 = [V_{ref} - (N+1)V_D]/R_t.$$

Here, $V_{ref}$ indicates a voltage determined within a zero-voltage switching circuit by receiving a supply voltage $V_{DD}$ and N is a whole number indicative of he number of diodes $D_4$ in excess of one. Subsequently, the procedure is repeatedly performed. At this time, the variation of a current determines a frequency. A frequency f (or 1/T) is obtained according to $$f = (C_t V)^{-1}$$

and $$I = C_t(dV/dt).$$

Here, $C_t$ indicates a capacity of a capacitor, I a charge or discharge current of a relaxation oscillator, dV incremental voltage change across the capacitor, and dt the incremental charging (or discharging) time of the capacitor. In particular, the earlier portion of interval M3 exhibits a steep charging slope because a frequency is suddenly varied in response to current $I_3$ being suddenly increased.

The invention also has obvious application to resonant inverters of full-bridge type and in dc-to-dc converters constructed from resonant inverters of half-bridge or full-bridge type. Any of the resonant inverters of half-bridge type is readily converted to a resonant inverter of full-bridge type by adjusting the capacitance of the capacitors $C_3$ and $C_4$ to be substantially the same as that of the capacitors $C_1$ and $C_2$, then connecting the capacitors $C_3$ and $C_4$ together with elements $Q_3$, $Q_4$, $D_5$, $D_6$, and $T_2$ corresponding to the elements $Q_1$, $Q_2$, $D_1$, $D_2$, and $T_1$. The capacitors $C_3$ and $C_4$ are connected together with the elements $Q_3$, $Q_4$, $D_5$, $D_6$, and $T_2$ the same way the capacitors $C_1$ and $C_2$ are connected together with the elements $Q_1$, $Q_2$, $D_1$, $D_2$, and $T_1$; and the primary windings of the split-phase transformers $T_1$ and $T_2$ are driven in antiphase, so transistors $Q_1$ and $Q_4$ are simultaneously conditioned for drain-to-source conduction, and so transistors $Q_2$ and $Q_3$ are simultaneously conditioned for drain-to-source conduction. Dc-to-dc converters can be constructed by using the primary winding of a transformer as the resonant inductor $L_r$, and rectifying currents from the secondary winding(s) of the transformer.

What is claimed is:

1. A combination comprising:
    a primary direct voltage supply having first and second terminals;
    a first switching transistor having a principal conduction path and a control electrode for receiving a first switching signal that at selected times has a first state that conditions the principal conduction path of said first switching transistor to be conductive;
    an inductor having a winding included with the principal conduction path of said first switching transistor in a first series connection formed when the principal conduction path of said first switching transistor is conductive, a first end of said winding connected for receiving current of a first polarity from said first terminal of said primary direct voltage supply via the principal conduction path of said first switching transistor at times when the principal conduction path of said first switching transistor is conductive;
    a first rectifier diode connected across the principal conduction path of said first switching transistor for conducting, at times when the principal conduction path of said first switching transistor is not conductive, a forward current of said first polarity supplied from the first end of said winding of said inductor;
    a first capacitor connected across the principal conduction path of said first switching transistor; and
    a switching signal generator for generating said first switching signal, said switching signal generator comprising:
        means for sensing the flow of said forward current through said first rectifier diode; and
        means for beginning, during each time the flow of said forward current through said first rectifier diode is sensed a respective one of said selected times said first switching signal has said first state that conditions the principal conduction path of said first switching transistor to be conductive.

2. The combination of claim 1, further comprising:
    a second switching transistor having a principal conduction path and a control electrode for receiving a second switching signal that at selected times has a second state that conditions the principal conduction path of said second switching transistor to be conductive, said winding of said inductor included with the principal conduction path of said second switching transistor in a second series connection formed when the principal conduction path of said second switching transistor is conductive, said first end of said winding connected for receiving current of a second polarity opposite to said first polarity from said second terminal of said primary direct voltage supply via the principal conduction path of said second switching transistor at times when the principal conduction path of said second switching transistor is conductive;

a second rectifier diode connected across the principal conduction path of said second switching transistor for conducting, at times when the principal conduction path of said second switching transistor is not conductive, a forward current of said second polarity supplied from the first end of said winding of said inductor; and a second capacitor connected across the principal conduction path of said second switching transistor; wherein said switching signal generator is of a type for generating said second switching signal in addition to said first switching signal and comprises:

means for sensing the flow of said forward current through said second rectifier diode; and means for beginning, during each time the flow of said forward current through said second rectifier diode is sensed a respective one of said selected times said second switching signal has said second state that conditions the principal conduction path of said second switching transistor to be conductive.

3. The combination of claim 2 included within a resonant inverter together with a resonant capacitor and a load resistance in parallel connection, said parallel connection included in said first series connection formed when the principal conduction path of said first switching transistor is conductive, and said parallel connection included in said second series connection formed when the principal conduction path of said second switching transistor is conductive.

4. The combination of claim 2 included within a resonant inverter of half-bridge type together with:

third and fourth capacitors, having respective first plates respectively connected to the first and second terminals of said primary direct voltage supply, and having respective second plates with an interconnection therebetween;

a resonant capacitor; and a load resistance in parallel connection with said resonant capacitor, said parallel connection included in said first series connection formed when the principal conduction path of said first switching transistor is conductive, which said first series connection extends to the interconnection between the second plates of said third and said fourth capacitors, said parallel connection included in said second series connection formed when the principal conduction path of said second switching transistor is conductive, said second series connection extends to the interconnection between the second plates of said third and said fourth capacitors.

5. A resonant inverter for use with a primary direct voltage supply having a relatively negative terminal and a relatively positive terminal between which a direct energizing potential is supplied, said resonant inverter comprising:

first and second terminals for receiving said direct energizing potential;

first, second, and third interconnection nodes;

first and second capacitors respectively connecting said first interconnection node to said first terminal and to said second interconnection node;

third and fourth capacitors respectively connecting said third interconnection node to said first terminal and to said second interconnection node;

a first switching transistor, having a principal conduction path connected at one end thereof to said first terminal and connected at the other end thereof to said first interconnection node, and having a control electrode for receiving a first switching signal that at selected times has a first state that conditions the principal conduction path of said first switching transistor to be conductive;

a second switching transistor having a principal conduction path connected at one end thereof to said first interconnection node and connected at the other end thereof to said second interconnection node, and having a control electrode for receiving a second switching signal that at selected times has a second state that conditions the principal conduction path of said second switching transistor to be conductive;

a resonant circuit connected between said first and third interconnection nodes for receiving via said first interconnection node a current of a first polarity when said first switching transistor is conductive, for receiving via said first interconnection node a current of a second polarity opposite to said first polarity when said second switching transistor is conductive, for supplying via said first interconnection node a current of said first polarity when conduction by said second switching transistor is discontinued, and for supplying via said first interconnection node a current of said second polarity when conduction by said first switching transistor is discontinued;

a first rectifier diode connected between said first interconnection node and said first terminal and poled for conducting as a forward current said current of said first polarity supplied from said resonant circuit when conduction by said second switching transistor is discontinued;

a second rectifier diode connected between said first and said second interconnection node and poled for conducting as a forward current said current of said second polarity supplied from said resonant circuit when conduction by said first switching transistor is discontinued; and a switching signal generator for generating said first and second switching signals, said switching signal generator comprising:

a bilaterally conductive circuit connecting said second terminal and said second interconnection mode;

means for detecting said first polarity of current flowing through said bilaterally conductive circuit from said second terminal to said second interconnection mode when said first rectifier diode is conductive and when said second rectifier diode is conductive;

means for beginning, during each continuous interval said first polarity of current flowing through said bilaterally conductive circuit from said second terminal to said second interconnection mode is detected owing to said first rectifier diode being conductive, a respective one of said selected times said first switching signal has said first state that conditions the principal conduction path of said first switching transistor to be conductive; and means for beginning, during each continuous interval said first polarity of current flowing through said bilaterally conductive circuit from said second terminal to said second interconnection mode is detected owing to said second rectifier diode being conductive, a respective one of said selected times said second switching signal has said second state that conditions the principal conduction path of said second switching transistor to be conductive.

6. A resonant inverter as set forth in claim 5 wherein said bilaterally conductive circuit connecting said second interconnection mode and said second terminal comprises:

a third rectifier diode connected for forward conduction from said second interconnection mode to said second terminal; and a fourth rectifier diode connected for forward conduction from said second terminal to said second interconnection mode.

7. A resonant inverter as set forth in claim 5 wherein said bilaterally conductive circuit connecting said second interconnection mode and said second terminal comprises:

a resistor.

8. A resonant inverter for use with a primary direct voltage supply having a relatively negative terminal and a relatively positive terminal between which a direct energizing potential is supplied, said resonant inverter comprising:

first and second terminals for receiving said direct energizing potential;

first, second, and third interconnection nodes;

first and second capacitors respectively connecting said first interconnection node to said first terminal and to said second interconnection node;

third and fourth capacitors respectively connecting said third interconnection node to said first terminal and to said second interconnection node;

a first switching transistor, having a principal conduction path connected at one end thereof to said first terminal and connected at the other end thereof to said first interconnection node, and having a control electrode for receiving a first switching signal that at selected times has a first state that conditions the principal conduction path of said first switching transistor to be conductive;

a second switching transistor having a principal conduction path connected at one end thereof to said first interconnection node and connected at the other end thereof to said second interconnection node, and having a control electrode for receiving a second switching signal that at selected times has a second state that conditions the principal conduction path of said second switching transistor to be conductive;

a resonant circuit connected between said first and third interconnection nodes for receiving via said first interconnection node a current of a first polarity when said first switching transistor is conductive, for receiving via said first interconnection node a current of a second polarity opposite to said first polarity when said second switching transistor is conductive, for supplying via said first interconnection node a current of said first polarity when conduction by said second switching transistor is discontinued, and for supplying via said first interconnection node a current of said second polarity when conduction by said first switching transistor is discontinued;

a first rectifier diode connected between said first interconnection node and said first terminal and poled for conducting as a forward current said current of said first polarity supplied from said resonant circuit when conduction by said second switching transistor is discontinued;

a second rectifier diode connected between said first and said second interconnection node and poled for conducting as a forward current said current of said second polarity supplied from said resonant circuit when conduction by said first switching transistor is discontinued; and a switching signal generator for generating said first and second switching signals, said switching signal generator comprising:

a bilaterally conductive circuit connecting said second terminal and said second interconnection mode;

means for detecting said first polarity of current flowing through said bilaterally conductive circuit from said second terminal to said second interconnection mode when said first rectifier diode is conductive and when said second rectifier diode is conductive;

a pulse generator for supplying pulses at a rate substantially equal to twice the resonant frequency of said resonant circuit;

a first flip-flop of set-reset or RS type, for supplying a true output signal reset in response to the leading edges of the pulses generated by said pulse generator;

an OR gate having a first input connection for receiving said true output signal of said first flip-flop, having a second input connection and having an output connection for supplying an OR gate response;

a second flip-flop of triggerable or T type for supplying a true output signal and a not-true output signal of opposite states, which opposite states change in response to trailing edges of the pulses generated by said first voltage comparator;

a first AND gate having a first input connection for receiving said OR gate response, having a second input connection for receiving said true output signal of said second flip-flop, and having an output connection for supplying first AND gate response;

a second AND gate having a first input connection for receiving said OR gate response, having a second input connection for receiving said not-true output signal of said second flip-flop, and having an output connection for supplying second AND gate response; and a transformer having a primary winding with a first end to which first AND gate response is applied and with a second end to which first AND gate response is applied, having a first secondary winding with first and second ends respectively connected to said first node and to the control electrode of said first switching transistor, and having a first secondary winding with first and second ends respectively connected to the control electrode of said second switching transistor and to said second node.

9. A resonant inverter as set forth in claim 8 wherein said pulse generator comprises:

a sawtooth oscillator for generating sawtooth oscillations; and a first voltage comparator comparing said sawtooth oscillations to a prescribed level, for generating pulses with leading and trailing edges, said pulses being separated by intervals when the amplitudes of said sawtooth oscillations exceed said prescribed level.

10. A resonant inverter as set forth in claim 9 wherein said means for detecting said first polarity of current flowing through said bilaterally conductive circuit from said second terminal to said second interconnection mode comprises:

a second voltage comparator, having an input circuit connected for comparing to a prescribed voltage the voltage appearing between said second terminal and said second interconnection mode, and having an output circuit connected for setting said true output signal of said first flip-flop in response to the voltage appearing said second interconnection mode being indicative of said first polarity of current flowing through said bilaterally conductive circuit from said second terminal to said second interconnection mode.

11. A resonant inverter as set forth in claim 10 wherein said bilaterally conductive circuit connecting said second interconnection mode and said second terminal comprises:

a third rectifier diode connected for forward conduction from said second interconnection mode to said second terminal; and a fourth rectifier diode connected for forward conduction from said second terminal to said second interconnection mode.

12. A resonant inverter as set forth in claim 10 wherein said bilaterally conductive circuit connecting said second interconnection mode and said second terminal comprises:

a resistor.

13. A resonant inverter as set forth in claim 9 wherein means for detecting said first polarity of current flowing through said bilaterally conductive circuit from said second terminal to said second interconnection mode comprises:

a lowpass filter for supplying a lowpass filter response to the voltage appearing between said second terminal and said second interconnection mode; and a second voltage comparator, having an input circuit connected for comparing said lowpass filter response to a prescribed voltage, and having an output circuit connected for setting said true output signal of said first flip-flop in response to the voltage appearing said second interconnection mode being indicative of said first polarity of current flowing through said bilaterally conductive circuit from said second terminal to said second interconnection mode.

14. A resonant inverter as set forth in claim 13 wherein said bilaterally conductive circuit connecting said second interconnection mode and said second terminal comprises:

a resistor.

15. A resonant inverter for use with a primary direct voltage supply having a relatively negative terminal and a relatively positive terminal between which a direct energizing potential is supplied, said resonant inverter comprising:

first and second terminals for receiving said direct energizing potential;

first, second, and third interconnection nodes;

first and second capacitors respectively connecting said first interconnection node to said first terminal and to said second interconnection node;

third and fourth capacitors respectively connecting said third interconnection node to said first terminal and to said second interconnection node;

a first switching transistor, having a principal conduction path connected at one end thereof to said first terminal and connected at the other end thereof to said first interconnection node, and having a control electrode for receiving a first switching signal that at selected times has a first state that conditions the principal conduction path of said first switching transistor to be conductive;

a second switching transistor having a principal conduction path connected at one end thereof to said first interconnection node and connected at the other end thereof to said second interconnection node, and having a control electrode for receiving a second switching signal that at selected times has a second state that conditions the principal conduction path of said second switching transistor to be conductive;

a resonant circuit connected between said first and third interconnection nodes for receiving via said first interconnection node a current of a first polarity when said first switching transistor is conductive, for receiving via said first interconnection node a current of a second polarity opposite to said first polarity when said second switching transistor is conductive, for supplying via said first interconnection node a current of said first polarity when conduction by said second switching transistor is discontinued, and for supplying via said first interconnection node a current of said second polarity when conduction by said first switching transistor is discontinued;

a first rectifier diode connected between said first interconnection node and said first terminal and poled for conducting as a forward current said current of said first polarity supplied from said resonant circuit when conduction by said second switching transistor is discontinued;

a second rectifier diode connected between said first and said second interconnection node and poled for conducting as a forward current said current of said second polarity supplied from said resonant circuit when conduction by said first switching transistor is discontinued; and a switching signal generator for generating said first and second switching signals, said switching signal generator comprising:

a bilaterally conductive circuit connecting said second terminal and said second interconnection mode, across which said bilaterally conductive circuit a voltage appears that is of a first polarity when either said first or second switching transistor is conducting current and that is of a second polarity when either said first or second rectifier diode;

a sawtooth oscillator for generating sawtooth oscillations with a period controlled by a control current;

a resistance generating said control current in response to said voltage appearing across said bilaterally conductive circuit;

a voltage comparator comparing said sawtooth oscillations to a prescribed level, for generating pulses with leading and trailing edges, said pulses being separated by intervals when the amplitudes of said sawtooth oscillations exceed said prescribed level;

a second flip-flop of triggerable or T type for supplying a true output signal and a not-true output signal of opposite states, which opposite states change in response to trailing edges of the pulses generated by said voltage comparator;

a first AND gate having a first input connection for receiving said OR gate response, having a second input connection for receiving said true output signal of said second flip-flop, and having an output connection for supplying first AND gate response;

a second AND gate having a first input connection for receiving said OR gate response, having a second input connection for receiving said not-true output signal of said second flip-flop, and having an output connection for supplying second AND gate response; and a transformer having a primary winding with a first end to which first AND gate response is applied and with a second end to which first AND gate response is applied, having a first secondary winding with first and second ends respectively connected to said first node and to the control electrode of said first switching transistor, and having a first secondary winding with first and second ends respectively connected to the control electrode of said second switching transistor and to said second node.

16. A resonant inverter as set forth in claim 15 wherein said resistance comprises first and second resistors in series connection with an interconnection between them and wherein a filter capacitance bypasses to said second terminal the interconnection between first and second resistors.

17. A resonant inverter as set forth in claim 16 wherein said bilaterally conductive circuit connecting said second interconnection mode and said second terminal comprises:

a third rectifier diode connected for forward conduction from said second interconnection mode to said second terminal; and at least a fourth rectifier diode connected for forward conduction in a path from said second terminal to said second interconnection mode.

18. A resonant inverter as set forth in claim 15 wherein said bilaterally conductive circuit connecting said second interconnection mode and said second terminal comprises:

a third rectifier diode connected for forward conduction from said second interconnection mode to said second terminal; and at least a fourth rectifier diode connected for forward conduction in a path from said second terminal to said second interconnection mode.

19. A resonant inverter as set forth in claim 15 wherein said bilaterally conductive circuit connecting said second interconnection mode and said second terminal comprises:

a third diode connected for forward conduction from said second interconnection mode to said second terminal.

* * * * *